(12) United States Patent
Ikeda

(10) Patent No.: US 7,011,734 B2
(45) Date of Patent: Mar. 14, 2006

(54) METHOD OF MANUFACTURING SEMICONDUCTOR DEVICE HAVING SILICIDE LAYER

(75) Inventor: Kazuto Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 195 days.

(21) Appl. No.: 10/685,796

(22) Filed: Oct. 16, 2003

(65) Prior Publication Data
US 2004/0092123 A1 May 13, 2004

(30) Foreign Application Priority Data
Oct. 17, 2002 (JP) .............................. 2002-303452

(51) Int. Cl.
C23C 14/34 (2006.01)
H01L 21/336 (2006.01)
B05D 3/02 (2006.01)

(52) U.S. Cl. ................ 204/192.2; 427/380; 427/383.3; 438/558; 438/197; 438/769

(58) Field of Classification Search ............. 204/192.2; 427/380, 383.3; 438/558, 197, 769
See application file for complete search history.

(56) References Cited

U.S. PATENT DOCUMENTS 5,874,342 A * 2/1999 Tsai et al. ................... 438/301
6,864,143 B1 * 3/2005 Shue et al. .................. 438/299
2003/0029715 A1 * 2/2003 Yu et al. .................... 204/192.2

FOREIGN PATENT DOCUMENTS

JP 11-111642 4/1999
JP 11-233456 8/1999

OTHER PUBLICATIONS

English translation of JP 11-233456.*
English translation of JP 11-111642.*
Ken Inoue et al.; IEDM 95-445, pp. 18.1.1 to 18.1.4, 1995. Discussed in the spec.
K. Goto et al.; IEDM 95-449, pp. 18.2.1 to 18.2.4, 1995. Discussed in the spec.

* cited by examiner

Primary Examiner—Steven Versteeg
(74) Attorney, Agent, or Firm—Westerman, Hattori, Daniels & Adrian, LLP

(57) ABSTRACT

A method of manufacturing a semiconductor device has the steps of: (a) evacuating a sputtering chamber to a pressure of $1.5 \times 10^{-8}$ torr to $9 \times 10^{-8}$ torr and heating a silicon substrate to a temperature of 330° C. to 395° C.; (b) sputtering Co on the heated silicon substrate; (c) after the step (b), forming a cap layer having a small oxygen transmission performance on the silicon substrate without exposing the silicon substrate in air; (d) after the step (c), performing primary annealing; (e) after the step (d), removing the cap layer and unreacted Co; and (f) after the step (e), performing secondary annealing by heating the silicon substrate to a temperature of 450° C. to 750° C.

15 Claims, 7 Drawing Sheets

METHOD OF MANUFACTURING SEMICONDUCTOR DEVICE HAVING SILICIDE LAYER

CROSS REFERENCE TO RELATED APPLICATION

This application is based on and claims priority of Japanese Patent Application No. 2002-303452 filed on Oct. 17, 2002, the entire contents of which are incorporated herein by reference.

BACKGROUND OF THE INVENTION

A) Field of the Invention

The present invention relates to a semiconductor device manufacturing method, and more particularly to a method of manufacturing a semiconductor device having a silicide layer on a silicon surface.

B) Description of the Related Art

An electric conductivity of a semiconductor device can be adjusted by doping impurities into semiconductor. A low resistivity, at approximately the same level as a metal resistivity, cannot be obtained. The gate electrode and source/drain electrodes of a MOS transistor are desired to have a resistance as small as possible. In order to lower the resistance of an electrode region, a silicide layer is formed on a silicon layer. Metal capable of being silicidated, such as Ni and Co, is deposited on a silicon layer and heated to conduct a silicidation reaction. Since the silicidation reaction does not occur on an insulating layer, a silicide layer can be formed only on an underlying silicon surface. This process is called a salicidation (self-aligned silicidation) process.

The silicidation process is divided into two stages. At the first stage, primary annealing is performed to form intermediate silicide, and at the second stage after unreacted metal is removed, a secondary silicidation process is performed to form silicide of a low resistivity.

The following techniques have been reported: after a metal layer capable of being silicidated is formed, the surface of the metal layer is covered with a cap layer of TiN or the like having a small oxygen transmission performance to prevent oxidation of the metal layer capable of being silicidated. For example, the primary annealing is performed at a temperature of 400° C. to 550° C., and the secondary annealing is performed at a temperature of 750° C. to 900° C. (IEDM 95-449).

It is also reported that a metal layer capable of being silicidated is formed by sputtering on a heated silicon substrate. For example, a silicon substrate is maintained at 450° C. and a Co film is formed by sputtering and then in-situ annealing is performed in vacuum by maintaining the temperature at 450° C. Primary annealing is performed in a nitrogen atmosphere and an unreacted Co film is removed. Thereafter, secondary annealing is performed in a nitrogen atmosphere (IEDM 95-445).

Japanese Patent Laid-open Publication No. HEI-11-111642 proposes to form a porous insulating layer such as a natural oxide film on a silicon substrate as a barrier layer and to sputter Co on the barrier layer at a high temperature of 450° C. After a Co film is formed by sputtering, in-situ annealing is performed to react the whole quantity of the deposited Co film with the silicon substrate. Thereafter, an unreacted Co layer and barrier layer are removed to perform primary annealing at 600° C. in a nitrogen atmosphere and secondary annealing is performed at 800° C. in a nitrogen atmosphere.

According to another proposal, a silicon substrate is heated to 400° C. without forming a barrier layer, and Co is sputtered at a low speed of 0.05 to 3 nm/sec to react the whole quantity of the sputtered Co with the substrate. Thereafter, primary annealing is performed at 600° C. and secondary annealing is performed at 800° C. in both embodiments described above, sputtering is performed after the sputtering chamber is once evacuated to a vacuum pressure of $10^{-9}$ torr.

Japanese Patent Laid-open Publication No. HEI-11-233456 proposes to sputter material which contains Co, while heating a silicon substrate to a temperature of 300° C. to 500° C. and to perform primary annealing in a nitrogen atmosphere at a temperature of 450° C. to 650° C. After an unreacted Co is removed, secondary annealing is performed in a nitrogen atmosphere at a temperature of 700° C. to 900° C. There is no disclosure of a vacuum pressure.

Although various silicidation processes have been proposed, it can be said that the details of a silicidation process capable of providing excellent electric characteristics and excellent controllability are not still elucidated.

SUMMARY OF THE INVENTION

An object of this invention is to provide a semiconductor device manufacturing method including a silicidation process capable of providing excellent electric characteristics and controllability.

Another object of this invention is to provide a semiconductor device manufacturing method including a silicidation process capable of providing excellent electric characteristics and shape stability without complicating manufacture facilities.

According to one aspect of the present invention, there is provided a method of manufacturing a semiconductor device having the steps of: (a) evacuating a sputtering chamber to a pressure of $1.5 \times 10^{-8}$ torr to $9 \times 10^{-8}$ torr and heating a silicon substrate to a temperature of 330° C. to 395° C.; (b) sputtering Co on the heated silicon substrate; (c) after the step (b), forming a cap layer having a small oxygen transmission performance on the silicon substrate without exposing the silicon substrate in air; (d) after the step (c), performing primary annealing; (e) after the step (d), removing the cap layer and unreacted Co; and (f) after the step (e), performing secondary annealing by heating the silicon substrate to a temperature of 450° C. to 750° C.

In this way, a semiconductor device can be formed which has a silicide layer having excellent electric characteristics and shape controllability. A high performance semiconductor device can be manufactured without using special manufacture facilities.

DESCRIPTION OF THE PREFERRED EMBODIMENTS

As semiconductor devices become miniaturized and the size of a MOS transistor becomes small, process techniques used heretofore have been found unsatisfactory in some cases. Co silicide is excellent in that it is not associated with the phenomenon that as the size becomes small, a resistivity per unit area increases as in the case of Ti silicide. However, Co silicide has the nature that its leak current is likely to increase as the size becomes small. The reason of leak current has been conventionally explained to be caused by spikes and the like. The present inventor made various experiments in order to discover a silicidation process capable of providing excellent electric characteristics and controllability.

FIGS. 1A to 1E are photographs showing scanning electron microscope (SEM) surface observation images of each Co sputterred layer deposited on a Si substrate under different conditions.

Figure 1E:
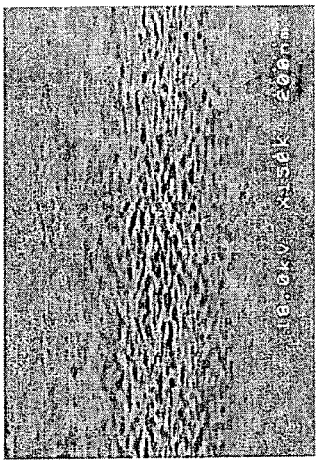
FIGS. 1A to 1E are SEM photographs showing the configuration of each Co film sputtered on a Si substrate.
Figure 1C:
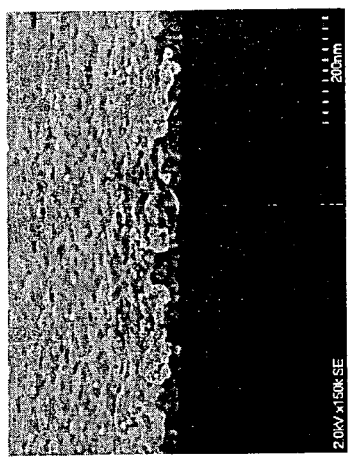
Figure 1D:
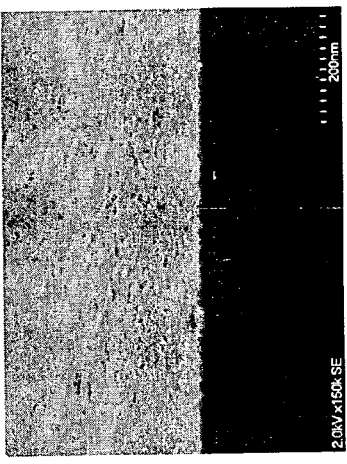
Figure 1A:
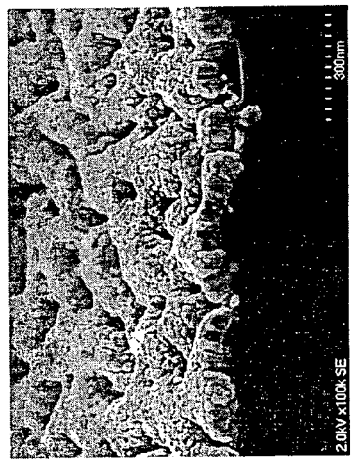
Figure 1B:

The photographs shown in FIGS. 1A to 1C were obtained from each Co layer having a thickness of 30 nm formed through high temperature sputtering. For the photograph shown in FIG. 1A, the vacuum pressure in a sputtering chamber before sputtering was set to $2\times10^{-7}$ torr and sputtering was performed at a substrate temperature of 450° C. It can be seen that the surface of the sputtered Co film is very rough.

For the observation image shown in FIG. 1B, the Co layer having a thickness of 30 nm was formed by sputtering under the conditions that the vacuum pressure in a sputtering chamber before sputtering was set to $5\times10^{-8}$ torr and sputtering was performed at a Si substrate temperature of 475° C. As compared to the photograph shown in FIG. 1A, the surface roughness is considerably reduced. However, the surface is still rough in partial areas.

The phenomenon that as the vacuum pressure is improved, the surface roughness is reduced, may be ascribed to some interaction of a deposited Co layer with foreign matters (impurities) attached to the substrate surface because of a poor vacuum pressure.

For the observation image shown in FIG. 1C, the Co layer having a thickness of 30 nm was formed by sputtering under the conditions that the vacuum pressure in a sputtering chamber before sputtering was set to $5\times10^{-8}$ torr and sputtering was performed at a slightly lowered Si substrate temperature of 450° C. It can be seen that the Co layer has an approximately uniform surface as a whole. It can be expected that the roughness of the film surface can be reduced by lowering the substrate temperature.

In summary, it can be said from these results that as the vacuum pressure becomes high, it becomes difficult to obtain a flat surface of a Co film formed by sputtering, and a sputtered Co film has a large roughness. As the vacuum pressure is improved from $10^{-7}$ torr to $10^{-8}$ torr, the morphology of the surface of a deposited Co film is improved greatly. The surface morphology depends also on a deposition temperature.

For the surface observation image shown in FIG. 1D, the same conditions as those for the image shown in FIG. 1C were used, i.e., the conditions that the vacuum pressure in a sputtering chamber before sputtering was set to $5\times10^{-8}$ torr and sputtering was performed at a Si substrate temperature of 450° C., excepting that a film thickness was reduced to 6 nm. It is generally difficult to maintain the surface flatness if the film is thinned. Almost a uniform surface is obtained even at a film thickness of 6 nm.

For the surface observation image shown in FIG. 1E, the Co film having a thickness of 6 nm was formed under the same conditions as those for the image shown in FIG. 1D, excepting a slightly worsened vacuum pressure of $6\times10^{-8}$ torr was used. Although the vacuum pressure is worsened from $5\times10^{-8}$ torr to $6\times10^{-8}$ torr, almost a uniform surface is obtained.

It can be understood from the experiment results shown in FIGS. 1A to 1E that the characteristics of a Co film formed on a heated Si substrate through sputtering are greatly influenced by a vacuum pressure in a sputtering chamber before sputtering and a temperature of a Si substrate during sputtering.

Figure 2A:
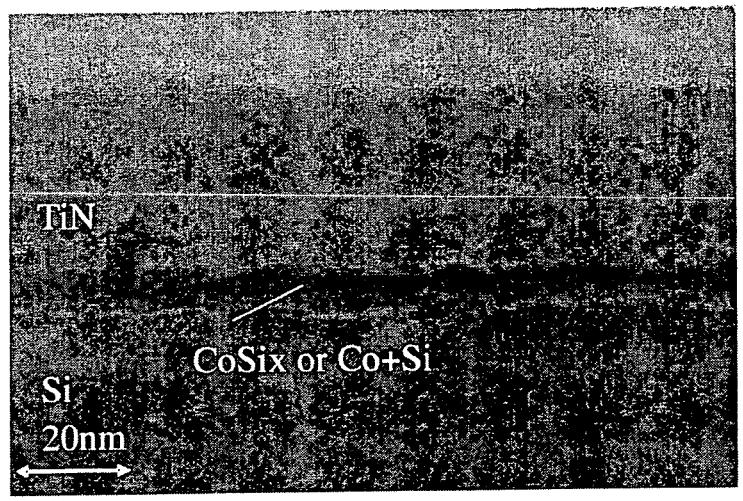
FIGS. 2A to 2C are cross sectional TEM photographs of each sample formed by forming a Co layer by sputtering at a different substrate temperature and forming a TiN layer on the Co layer by sputtering.
Figure 2B:
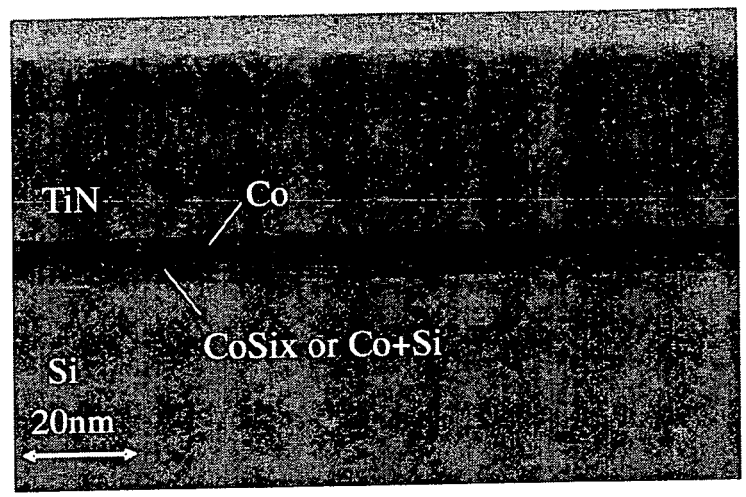
Figure 2C:
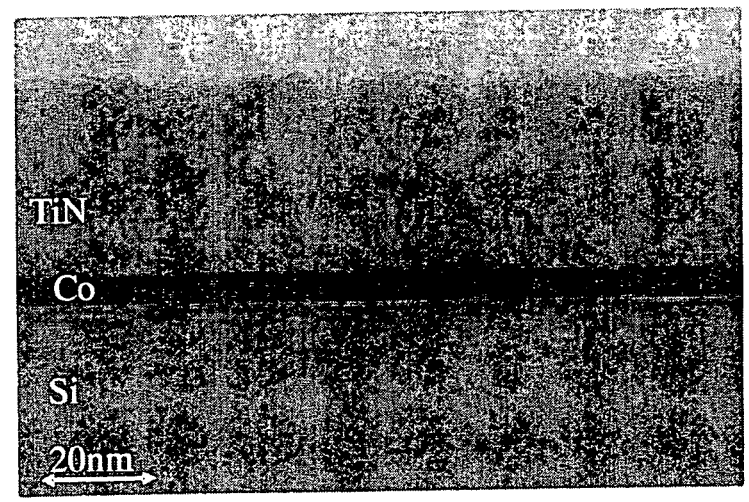

FIGS. 2A to 2C are transmission electron microscope (TEM) observation images showing the configuration of each deposited film formed at a different Si substrate temperature during sputtering. In this experiment, each Co film having a thickness of 5 nm was deposited on a Si substrate at a different substrate temperature by sputtering and thereafter, a TiN layer having a thickness of about 30 nm was deposited by sputtering at a temperature of 150° C. A sputtering temperature of 150° C. was adopted for stabilizing the sputtering process.

FIGS. 2A and 2B are photographs of samples obtained by depositing Co films having a thickness of 5 nm by sputtering and depositing a TiN film on the Co film at 150° C. under the conditions that a vacuum pressure before sputtering was set to $2\times10^{-8}$ torr and the Si substrate temperatures were set to 355° C. and 280° C., respectively.

In FIG. 2A, a Co layer is not observed. Co sputtered at a substrate temperature of 355° C. reacts or is mixed with the Si substrate and becomes a $CoSi_x$ layer or a Co+Si mixed layer. The whole quantity of sputtered Co enters Si (or is mixed with a surface layer Si) to form a layer of a mixture of Co and Si. The TiN layer is formed on this layer.

FIG. 2B shows an observation image when Co was deposited on a Si substrate at a temperature of 280° C. Similar to FIG. 2A, a layer of a mixture of Co and Si ($CoSi_x$ layer or Co+Si mixed layer) is formed on a Si substrate surface, and a Co layer is formed on this layer. It is considered that as the temperature becomes low, an interaction (reaction) between sputtered Co and the Si substrate becomes weak.

Even if low temperature sputtering is performed once and thereafter the temperature is raised to, e.g., 355° C., such a deposited layer cannot be formed which is similar to a layer obtained by sputtering under the conditions that the Si substrate is maintained at a high temperature (e.g., 355° C.) from the beginning. From these results, the mixed layer of Co and Si is considered to be formed by the synergy achieved by a heated substrate and a sputtering energy. This layer is hereinafter called a composite layer.

FIG. 2C is a TEM photograph showing a sample formed at a substrate temperature of 30° C. by forming a Co layer and a TiN layer in this order on the substrate at a vacuum pressure of $3 \times 10^{-8}$ torr before sputtering. As Co was sputtered at a substrate temperature of 30° C., the composite layer of Co and Si was not observed but a Co layer was formed on the Si substrate and a TiN layer was formed on the Co layer.

As above, as a Si substrate is heated and a Co film is formed on the substrate surface by sputtering, the sputtered Co and the Si substrate react or mix with each other depending upon the substrate temperature to form a composite layer of Co and Si. Co atoms in the Co layer must move in the Co layer in order to meet Si atoms. Co atoms in the composite layer are expected to meet Si atoms immediately or by a very short movement. Depending upon this initial state difference, the effects of later heat treatment become different as confirmed by the following experiments.

Figure 3A:
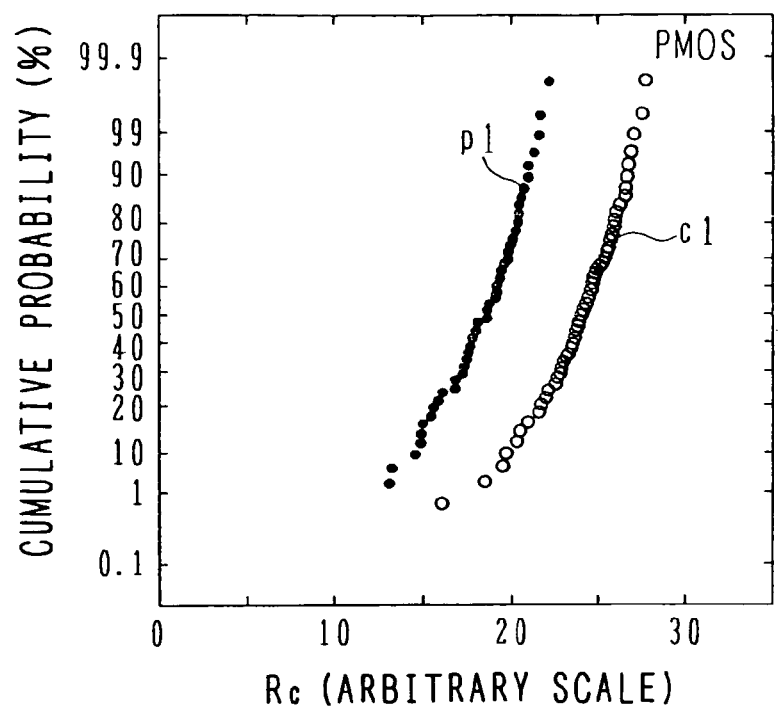
FIGS. 3A and 3B are a graph showing the contact characteristics of each sample formed at a different secondary annealing temperature and a graph showing the impurity concentration distribution of each contact region.
Figure 3B:
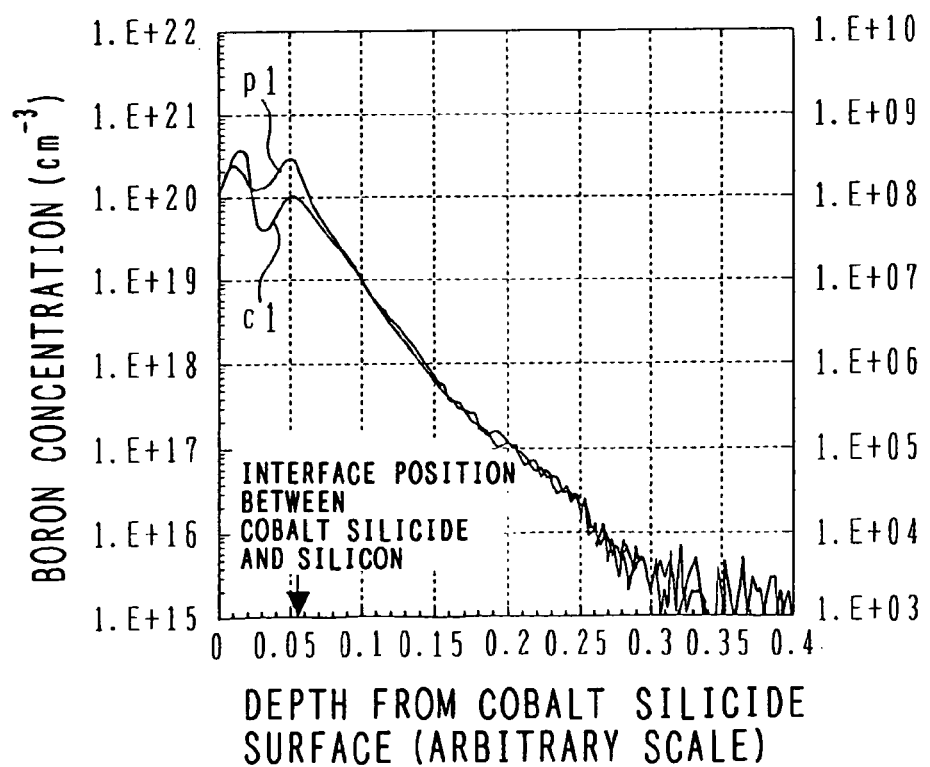

FIGS. 3A and 3B are graphs showing the contact characteristics at a different Si substrate temperature during Co layer sputtering, and a secondary annealing temperature.

After boron (B) ions were implanted and activation annealing was performed, a Co film having a thickness of about 6 nm was formed by sputtering. A vacuum pressure before sputtering was $6 \times 10^{-8}$ torr. Comparison samples were formed by sputtering without intentionally performing heating as in conventional techniques. Namely, Co sputtering was performed at a substrate temperature of 150° C., primary annealing was performed for 30 seconds at 500° C. in a nitrogen atmosphere, and secondary annealing was performed at 840° C.

For samples subjected to the high temperature sputtering, a Co layer was formed at a substrate temperature of 450° C. by sputtering, a TiN layer was formed covering the Co layer. After primary annealing was performed for 30 seconds at 500° C. in a nitrogen atmosphere, secondary annealing was performed at 700° C. in a nitrogen atmosphere. For samples with the high temperature sputtering, sufficiently low resistance can be obtained even if the secondary annealing temperature is lowered.

FIG. 3A is the graph showing the resistance characteristics of samples. The abscissa represents a resistance value in an arbitrary scale, and the ordinate represents a cumulative probability in the unit of %. As compared to a probability curve c1 according to conventional techniques, a probability curve p1 with high temperature sputtering and a lowered secondary annealing temperature shows a considerably lowered resistance value. In order to elucidate this reason, a boron (B) concentration was measured along a substrate depth direction.

The graph shown in FIG. 3B shows a B concentration depth profile in samples. The abscissa represents a depth from a cobalt silicide surface in an arbitrary scale, and the ordinate represents a boron concentration in the unit of $cm^{-3}$. An interface position between cobalt silicide and silicon is indicated by an arrow. It can be observed from the samples c1 formed according to conventional techniques that the boron concentration lowers near at the interface with the silicide layer. For the samples p1 with the high temperature sputtering and a lowered secondary annealing temperature, although the boron concentration near at the interface is not constant, it can be maintained fairly high as compared to the samples c1.

A high contact resistance value of the samples c1 may be ascribed to a lowered boron concentration of a silicon region in contact with the silicide. A low contact resistance of the samples p1 may be ascribed to that the boron concentration of silicon in the interface region with the silicide is maintained high.

It can be seen from the experiment results shown in FIGS. 3A and 3B that as the secondary annealing temperature is raised, impurities in semiconductor are attracted to the silicide layer to lower the effective impurity concentration and raise the contact resistance. The contact resistance can be maintained low by lowering the secondary annealing temperature to limit the impurity quantity to be absorbed in the silicide region.

Although the secondary annealing of the experiment was performed at 700° C., the good results can be expected by setting the secondary annealing temperature to 450° C. to 750° C. The secondary annealing temperature is more preferably set to 500° C. to 700° C.

The primary annealing is generally performed for a primary silicidation reaction between metal and silicon, and is performed at a lower temperature than that of the secondary annealing. High temperature sputtering is considered to present the state that a silicide reaction starts already or that a silicide reaction is likely to occur. The primary annealing is required only to form intermediate silicide, along with the high temperature sputtering. It can be considered that the load of the primary annealing is reduced more than that with the low temperature sputtering. The primary annealing temperature may be lowered. An annealing time can be shortened assuming the same temperature.

For example, the primary annealing temperature may be set to 450° C. to 550° C. The primary annealing temperature is set lower than the secondary annealing temperature.

A contact resistance can be lowered by raising the substrate temperature during sputtering and lowering the secondary annealing temperature. However, if the substrate temperature is raised during sputtering, it can be considered that the composite layer becomes the reason of leak current. Another problem is whether the reaction between sputtered metal and a silicon substrate is performed with good controllability.

First, B ions are implanted into a Si substrate to form a p-type well. P ions are implanted in this p-well to form an n-type region. After activation annealing is performed, the surface of the substrate is cleaned. Each substrate is transported into a sputtering chamber and a Co film having a thickness of 5 nm is deposited by high temperature sputtering at a different substrate temperature and the same vacuum pressure of $2 \times 10^{-8}$ torr before sputtering. Depending upon a substrate temperature, a pure Co film is not formed but the composite film of Co and Si is formed. A Co film thickness of 5 nm is the thickness of the Co film on the insulating film.

After Co sputtering, a TiN cap layer having a thickness of about 30 nm is formed. Primary annealing was performed for 30 seconds at 520° C. in a nitrogen atmosphere, and secondary annealing was performed for 30 seconds at 700° C. in a nitrogen atmosphere.

The substrate temperatures during sputtering were set to 445° C. (#7), 405° C. (#8), 380° C. (#9), 355° C. (#10), 330° C. (#11), and 280° C. (#12), respectively. A junction leak current of each of these samples was measured.

Figure 4A:
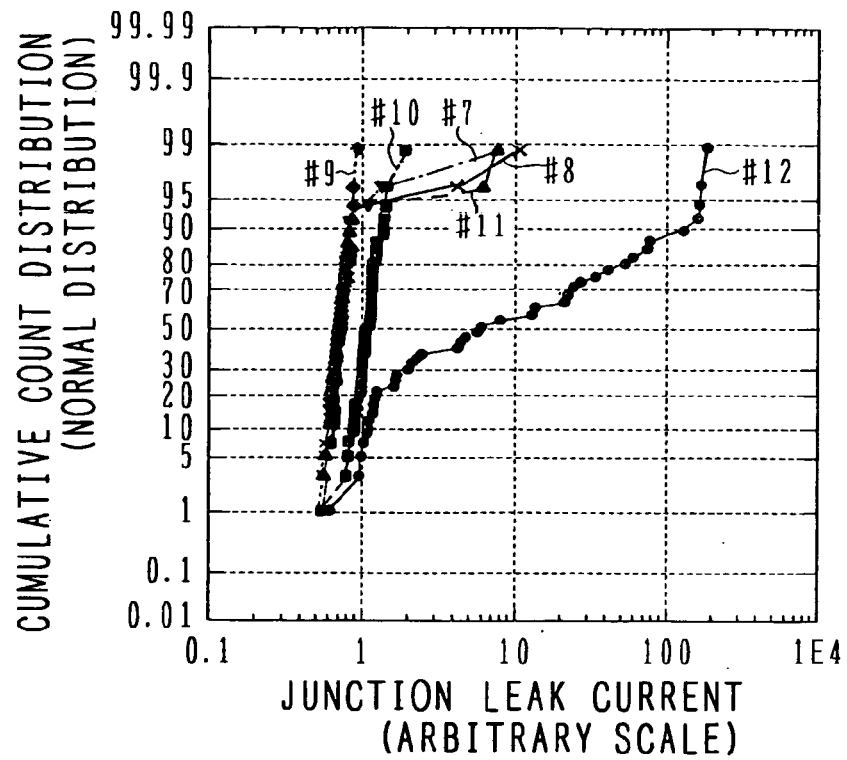
FIGS. 4A and 4B are graphs showing the leak current characteristics of each sample formed by forming a Co silicide layer on an n-type region in a p-well.

FIG. 4A is a graph showing a leak current and a cumulative count distribution. The abscissa represents a junction leak current in an arbitrary scale and the ordinate represents a cumulative count distribution according to the normal distribution. A rise of each sample has almost the same tendency. However, the sample #12 obtained by the lowest Co sputtering temperature has the distribution that a leak current increases from a low cumulative count of about 30% to a high value of about two digits (orders of magnitude).

The other samples show the good characteristics up to about 95%. Of these samples, the samples #7, #8 and #11 deteriorate their leak current by about one digit. The samples #9 and #10 maintain a good and low leak current up to about 99%.

It can be judged from these results that the leak current of the samples subjected to sputtering at the substrate temperature of 355° C. or 380° C. can be maintained at a very low level. The leak current of the samples subjected to sputtering at the substrate temperature of 330° C. to 445° C. is maintained generally at the good level. The samples subjected to sputtering at the lowest temperature of 280° C. have a considerably large leak current.

It can be considered from the studies of these results that the leak current can be maintained at a good level if the sputtering is performed at a substrate temperature of about 330° C. or higher. The substrate temperature during sputtering is more preferably set to 345° C. to 390° C. With this setting, a very low level of the leak current can be expected.

The leak current of samples at the lowered substrate temperature of 30° C. during sputtering was also measured. The vacuum pressure before sputtering was set to $3 \times 10^{-8}$ torr and the thicknesses of sputtered Co films at the substrate temperature of 30° C. were 5 nm (#13) and 4.5 nm (#13-1). After Co sputtering, a TiN film having a thickness of 30 nm was formed by sputtering. Primary annealing was performed for 30 seconds at 520° C. in a nitrogen atmosphere, and secondary annealing was performed for 30 seconds at 700° C. in a nitrogen atmosphere.

Figure 4B:
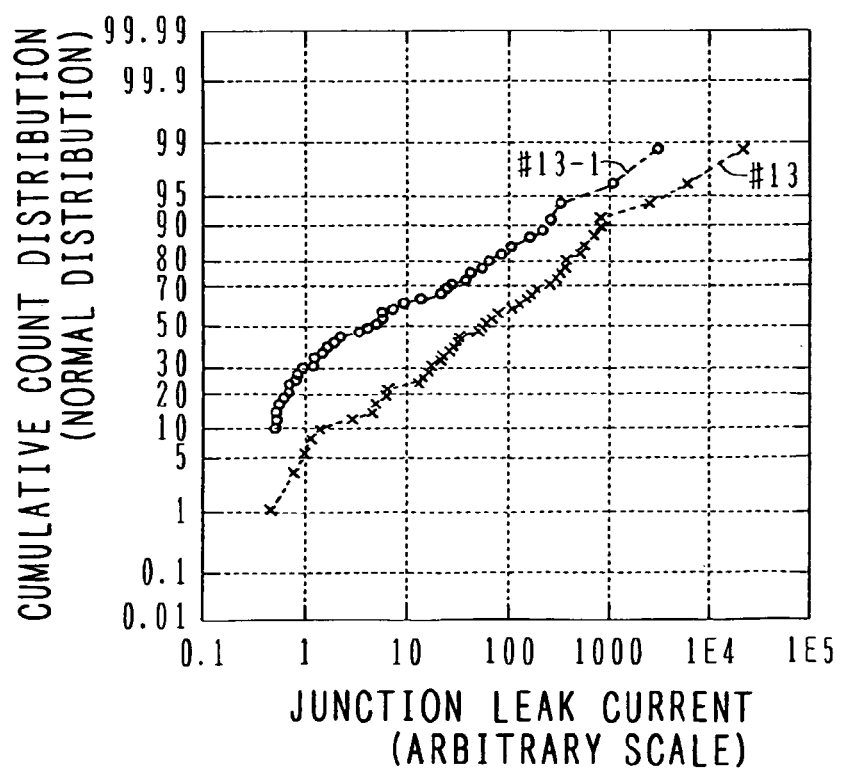

FIG. 4B shows the leak current characteristics of the samples #13 and #13-1. The abscissa represents a junction leak current in an arbitrary scale and the ordinate represents a cumulative count distribution. Both samples show gently inclined curves from the rise points, and leak currents are generated to a considerable degree in a broad range of possibly levels. From the viewpoint of reducing leak current, it is essential to heat the substrate during sputtering.

The data shown in FIG. 4A were obtained by forming a Co film having a thickness of 5 nm by sputtering. The effects of other thicknesses were also checked. The leak current characteristics were checked by changing a Co layer thickness at the substrate temperature of 355° C. which presented the good measurement results shown in FIG. 4A. The vacuum pressure before sputtering was set to $2 \times 10^{-8}$ torr, the primary annealing was performed in a nitrogen atmosphere at a temperature of 520° C. and the secondary annealing was performed in a nitrogen atmosphere at a temperature of 700° C. The thicknesses of sputtered Co layers on insulating films were 5 nm (#10), 4 nm (#10-1), 6 nm (#10-2) and 7 nm (#10-3).

Figure 5:
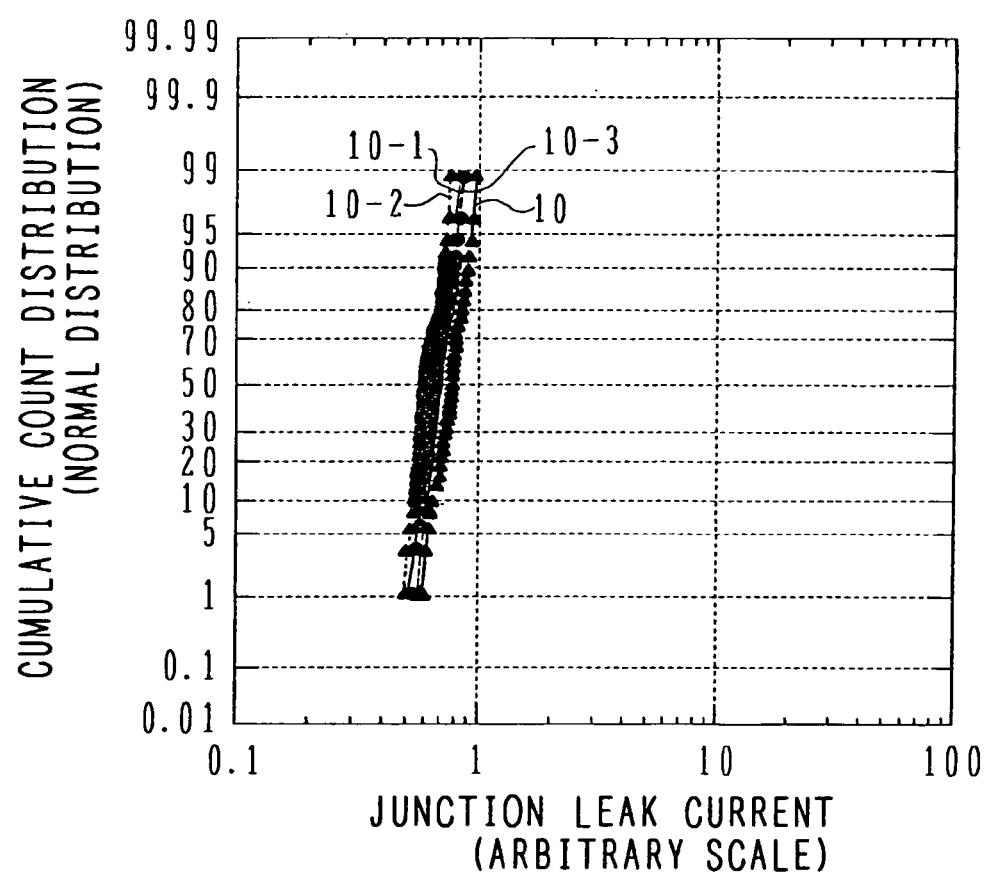
FIG. 5 is a graph showing the leak current characteristics of each sample having a different film thickness.

FIG. 5 shows the measurement results of leak current. The abscissa represents a junction leak current in an arbitrary scale and the ordinate represents a cumulative count distribution according to the normal distribution. The characteristics of the samples are quite similar and distribute concentratedly on the same line. Almost 99% of the samples have the leak current suppressed to very low values.

A very low leak current can be realized by using the Co layer having a thickness of 4 nm to 7 nm. This result is also expected for the case that the Co layer thickness is further reduced.

The above experiments were made paying attention to the amplitude of the leak current. Silicide increases its volume during the reaction, and in some cases has the nature (climb-up) of extending the silicide layer up to an adjacent insulating film. The inventor has studied the configuration of each silicide layer formed on the substrate at sputtering temperatures of 445° C., 405° C., 380° C. and 355° C. which showed good results of the leak current.

FIGS. 6A to 6D are photographs showing the shape of each silicide layer formed by sputtering at the temperatures of 445° C., 405° C., 380° C. and 355° C. A region surrounded by a broken line in FIGS. 6A and 6B corresponds to a silicon region, and both sides of the silicon region correspond to the insulating isolation region.

Figure 6C:
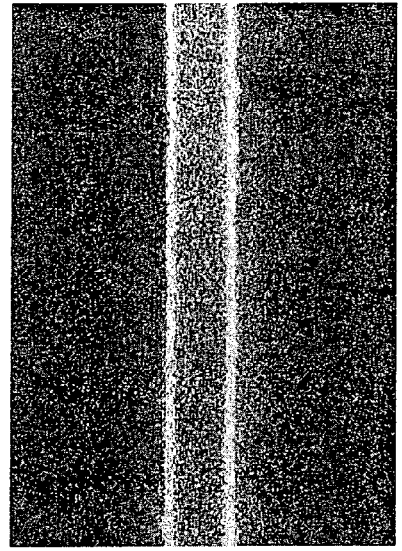
FIGS. 6A to 6D are SEM photographs showing the configuration of each substrate surface formed with a silicide layer.
Figure 6D:
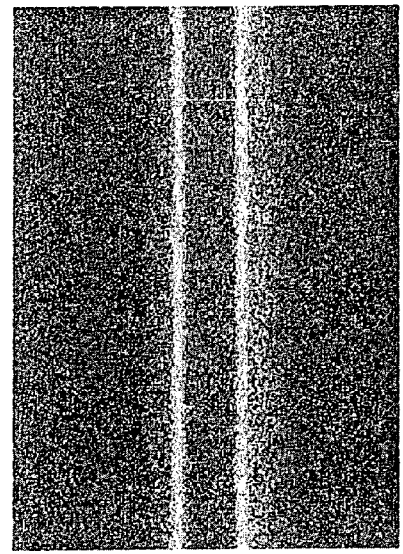
Figure 6A:
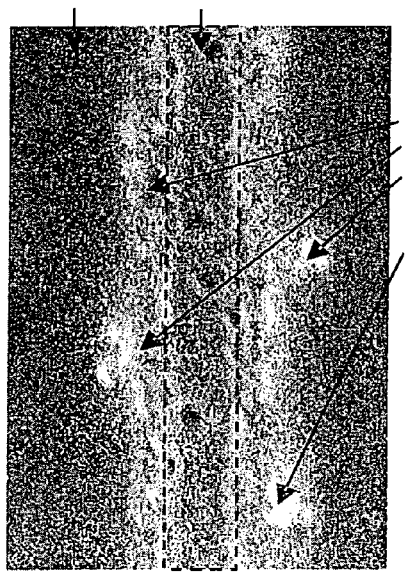

As shown in FIG. 6A, at the sputtering temperature of 445° C., silicide is not only formed on the silicon region but also extends up to the isolation region to a considerable width. Silicide climbs up to the isolation region and distributes in a range wider than the wiring layer. If the shape of the silicide layer is not controllable, there is a possibility that wiring lines are electrically short-circuited in an unexpected area. It is desired that the climb-up of silicide up to the isolation region is as little as possible.

Figure 6B:
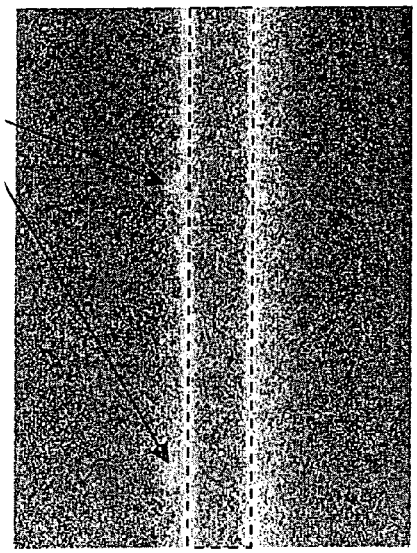

As shown in FIG. 6B, at the sputtering temperature of 405° C., although the climb-up is more suppressed than the climb-up shown in FIG. 6A, the climb-up of silicide on the isolation region is still definite. But, the quantity of climbed-up silicide is small.

At the sputtering temperature of 380° C. shown in FIG. 6C and the sputtering temperature of 355° C. shown in FIG. 6D, the area of silicide is limited only to the same region as the underlying silicon region and silicide is not formed on the surface of the isolation region to maintain the surface clean.

It can be said from these results that the substrate temperature during sputtering is preferable lower than 400° C. or more preferably 395° C. or lower, in order to form the silicide layer only on the silicon surface without making silicide climb up to the insulating layer. It is expected that at the sputtering temperature of 390° C. or lower, the climb-up of silicide can be prevented almost completely.

When both the leak current characteristics and the climb-up of silicide on the insulating layer are taken into consideration, the temperature of a Si substrate during sputtering is preferably in a range from 330° C. to 395° C. and more preferably in a range from 345° C. to 390° C.

Impurities and the like flying and reaching the substrate surface can be reduced if the vacuum pressure is low. However, in this case, a specific vacuum system is required to obtain a vacuum pressure of $10^{-9}$ torr and it takes a long evacuation time. Practically satisfactory results were obtained in the vacuum pressure range from $2 \times 10^{-8}$ torr to $6 \times 10^{-8}$ torr. Satisfactory results can be expected in the vacuum pressure range from $1.5 \times 10^{-8}$ torr to $9 \times 10^{-8}$ torr. It is preferable to set the vacuum pressure to $1.5 \times 10^{-8}$ torr to $6 \times 10^{-8}$ torr.

FIGS. 7A to 7E are cross sectional views illustrating the main processes of manufacturing a semiconductor device basing upon the above-described experiment results.

Figure 7A:
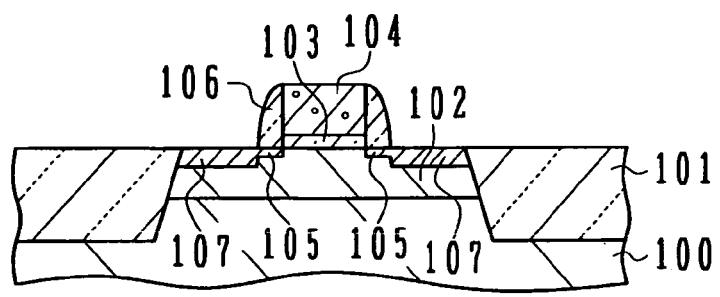
FIGS. 7A to 7E are cross sectional views illustrating processes of forming a MOS transistor according to an embodiment of the invention.

As shown in FIG. 7A, a shallow trench is formed in the surface layer of a silicon substrate 100, insulating material such as silicon oxide is buried in this trench, and the surface thereof is planarized to form a shallow trench isolation (STI) 101. Impurity ions, e.g., B ions, are implanted into an active region defined by STI to form a p-type well 102.

On the surface of the active region, a gate insulating film 103 having a predetermined thickness, e.g., about 3 nm, is formed through thermal oxidation for example. A polycrystalline silicon layer 104 is formed on the gate insulating film 103. The polysilicon layer 104 is patterned by photolithography and etching to form an insulated gate electrode 104. Thereafter, n-type impurity ions, e.g., P or As ions, are implanted to form extension regions 105 of source/drain regions. A silicon oxide layer or the like is deposited on the substrate surface by chemical vapor deposition (CVD) or the like and anisotropic etching such as reactive ion etching (RIE) is preformed to form insulating side wall spacers 106 only on the side walls of the gate electrode. Impurity ions of n-type are again implanted to form high impurity concentration source/drain regions 107. After a MOS transistor structure is formed in this way, a silicide layer is to be formed on an exposed silicon surface by a salicide process.

Figure 7B:
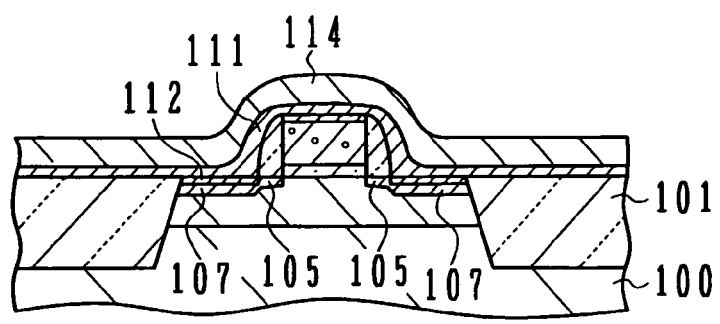

As shown in FIG. 7B, the silicon substrate 100 is heated to a temperature of 330° C. to 395° C., more preferably to a temperature of 345° C. to 390° C., e.g., to 355° C., and Co is deposited by sputtering. The deposited Co layer 111 is partially mixed with Si on the silicon layer to form a Co—Si composite layer 112. A TiN layer 114 is deposited on the Co layer 111 at a substrate temperature of 150° C. to a thickness of 30 nm for example.

Figure 7C:
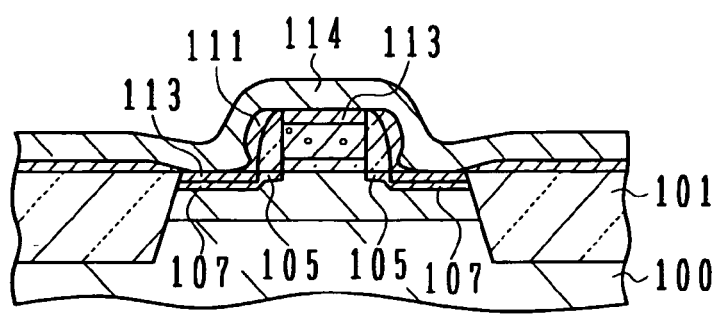

Depending upon the substrate temperature during sputtering and the deposition speed, the total quantity of Co can be consumed in a composite layer of Co—Si and the Co layer disappears, as shown in FIG. 7C. The Co layer 111 remains deposited only on the surface of the insulating film. In-situ annealing may be performed after sputtering to enhance the reaction and obtain the structure shown in FIG. 7C.

In this state, primary annealing is performed at a temperature of 450° C. to 550° C. The atmosphere is a nitrogen atmosphere for example. With the primary annealing, a primary silicidation process occurs between Co and Si to form a primary silicidated layer 113.

Figure 7D:
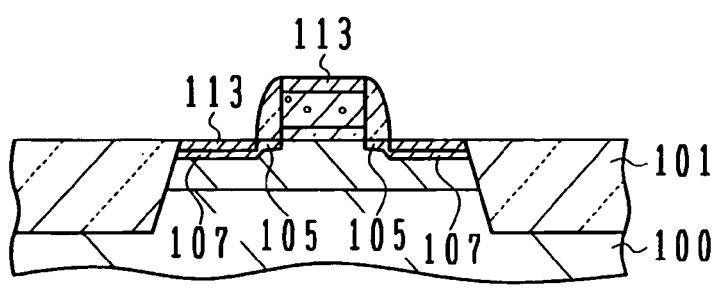

As shown in FIG. 7D, the unreacted Co layer 111 along with the TiN layer 114 are removed by a mixture of sulfuric acid and hydrogen peroxide. The silicide layer 113 is left on the exposed silicon surface.

Figure 7E:
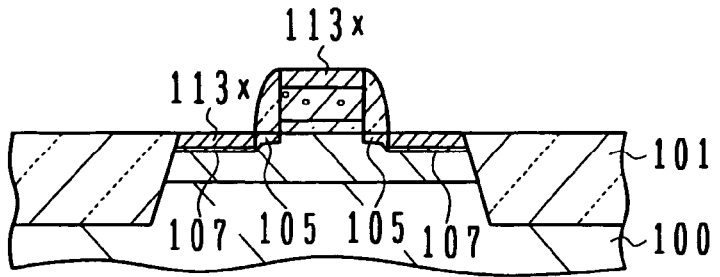

As shown in FIG. 7E, the substrate is heated in a nitrogen atmosphere to a temperature of 450° C. to 750° C. or more preferably to a temperature of 500° C. to 700° C. to perform secondary annealing. With this secondary annealing, the high resistance silicide layer 113 is changed to a low resistance silicide layer 113x. The source/drain regions and gate electrode formed with the low resistance silicide layer are obtained in the manner described above.

The present invention has been described in connection with the preferred embodiments. The invention is not limited only to the above embodiments. For example, a p-channel MOS transistor can be formed by reversing the conductivity type in the processes shown in FIGS. 7A to 7E. A CMOS circuit can be formed by forming an n-channel MOS transistor and a p-channel MOS transistor. It will be apparent to those skilled in the art that other various modifications, improvements, combinations, and the like can be made.

What we claim are:

1. A method of manufacturing a semiconductor device comprising the steps of:
   (a) evacuating a sputtering chamber to a pressure of $1.5 \times 10^{-8}$ torr to $9 \times 10^{-8}$ torr and heating a silicon substrate to a temperature of 330° C. to 395° C.;
   (b) sputtering Co on said heated silicon substrate;
   (c) after said step (b), forming a cap layer having a small oxygen transmission performance on said silicon substrate without exposing said silicon substrate in air;
   (d) after said step (c), performing primary annealing;
   (e) after said step (d), removing said cap layer and unreacted Co; and
   (f) after said step (e), performing secondary annealing by heating said silicon substrate to a temperature of 450° C. to 750° C.

2. A method of manufacturing a semiconductor device according to claim 1, wherein said step (a) evacuates said sputtering chamber to a pressure of $1.5 \times 10^{-8}$ torr to $6 \times 10^{-8}$ torr.

3. A method of manufacturing a semiconductor device according to claim 1, wherein said step (a) heats said silicon substrate to a temperature of 345° C. to 390° C.

4. A method of manufacturing a semiconductor device according to claim 1, wherein said step (b) is executed under a condition that a Co film having a thickness of about 7 nm or thinner is deposited on an insulating film.

5. A method of manufacturing a semiconductor device according to claim 1, wherein said step (b) forms only a Co—Si composite layer on a silicon surface without forming a Co film.

6. A method of manufacturing a semiconductor device according to claim 1, wherein said cap layer is made of a Ti layer or a TiN layer.

7. A method of manufacturing a semiconductor device according to claim 1, wherein said step (c) is executed in a state that a temperature of said silicon substrate is 200° C. or lower.

8. A method of manufacturing a semiconductor device according to claim 1, wherein said step (d) is executed by heating said silicon substrate to a temperature of 450° C. to 550° C.

9. A method of manufacturing a semiconductor device according to claim 1, wherein said step (f) is executed by heating said silicon substrate to a temperature of 500° C. to 700° C.

10. A method of manufacturing a semiconductor device according to claim 1, further comprising, before said step (a) a step of:
    (x) forming a polysilicon gate electrode, insulating side wall spacers and source/drain regions respectively of a MOS transistor on said silicon substrate, wherein said steps (a) to (f) form a Co silicide layer on said gate electrode and said source/drain regions by a salicide process.

11. A method of manufacturing a semiconductor device according to claim 1, wherein said step (a) evacuates said sputtering chamber to a pressure of $1.5 \times 10^{-8}$ torr to $6 \times 10^{-8}$ torr and heats said silicon substrate to a temperature of 345° C. to 390° C.

12. A method of manufacturing a semiconductor device according to claim 1, wherein said step (b) is executed under a condition that a Co film having a thickness of about 7 nm or thinner is deposited on an insulating film and forms only a Co—Si composite layer on a silicon surface without forming a Co film.

13. A method of manufacturing a semiconductor device according to claim 1, wherein said step (a) heats said silicon substrate to a temperature of 345° C. to 390° C. and said step (d) is executed by heating said silicon substrate to a temperature of 450° C. to 550° C.

14. A method of manufacturing a semiconductor device according to claim 13, wherein said step (f) is executed by heating said silicon substrate to a temperature of 500° C. to 700° C.

15. A method of manufacturing a semiconductor device comprising the steps of:
    (a) forming a polysilicon gate electrode, insulating side wall spacers and source/drain regions respectively of a MOS transistor on a silicon substrate, (b) evacuating a sputtering chamber to a pressure of $1.5 \times 10^{-8}$ torr to $9 \times 10^{-8}$ torr and heating said silicon substrate to a temperature of 330° C. to 395° C.;

(c) sputtering Co on said heated silicon substrate;

(d) after said step (c), forming a cap layer having a small oxygen transmission performance on said silicon substrate without exposing said silicon substrate in air;

(e) after said step (d), performing primary annealing;

(f) after said step (e), removing said cap layer and unreacted Co; and (g) after said step (f, performing secondary annealing by heating said silicon substrate to a temperature of 450° C. to 750° C., wherein said steps (b) to (g) form a Co silicide layer on said gate electrode and said source/drain regions by a salicide process.

* * * * *